United States Patent [19]
Kalb, Jr.

[11] Patent Number: 5,889,409
[45] Date of Patent: *Mar. 30, 1999

[54] LEAKAGE TRACKING DEVICE SAMPLE FOR IDDQ MEASUREMENT AND DEFECT RESOLUTION

[75] Inventor: Jeffrey C. Kalb, Jr., Pheonix, Ariz.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 721,685

[22] Filed: Sep. 27, 1996

[51] Int. Cl.$^6$ .................................................. G01R 31/26
[52] U.S. Cl. .......................................... 324/765; 324/763
[58] Field of Search .................................. 324/765, 763; 371/21.1, 21.2, 21.4; 365/201

[56] References Cited

U.S. PATENT DOCUMENTS

| | | | |
|---|---|---|---|
| 5,332,973 | 7/1994 | Brown et al. | 324/537 |
| 5,570,034 | 10/1996 | Needham et al. | 324/763 |
| 5,670,892 | 9/1997 | Sporck | 324/765 |

OTHER PUBLICATIONS

David G. Edwards, *Testing for MOS Integrated Circuit Failure Modes*, IEEE, Reprint from Proceedings International Test Conference 1980, pp. 303–312. (Month Unavailable).

Thomas M. Storey and Wojciech Maly, *CMOS Bridging Fault Detection*, IEEE, Reprint from Proceedings International Test Conference, 1990, pp. 325–334. (Month Unavailable).

Robert C. Atken, *A Comparison of Defect Models For Fault Location with IDDQ Measurements*, IEEE, Reprint from Proceedings International Test Conference 1992, pp. 335–344. (Month Unavailable).

Charles F. Hawkins and Jerry M. Soden, *Electrical Characteristics and Testing Considerations For gate Oxide Shorts In CMOS ICs*, IEEE, Reprint from Proceedings International Test Conference 1995, pp. 313–324. (Month Unavailable).

*Primary Examiner*—Josie Ballato
*Assistant Examiner*—Russell M. Kobert
*Attorney, Agent, or Firm*—Blakely, Sokoloff, Taylor & Zafman LLP

[57] ABSTRACT

A method for detecting defect in a semiconductor device using IDDQ testing techniques that are not dependent upon the background leakage current for defect resolution. One embodiment of the present invention uses device sampling, i.e. creates a small sample of a device that is representative of the whole device, such that the ratio of the quiescent current of the device to the quiescent current of the sample exhibits a linear relationship to the ratio of the component count of the device to the component count of the sample.

7 Claims, 5 Drawing Sheets

LEAKAGE TRACKING DEVICE SAMPLE FOR IDDQ MEASUREMENT AND DEFECT RESOLUTION

FIELD OF THE INVENTION

This invention relates to the field of testing semiconductor devices for defects, and more specifically, to methods for detecting defects in a semiconductor device using IDDQ testing incorporating device sampling.

BACKGROUND OF THE INVENTION

In the manufacture of semiconductor devices it is important to have methods for testing a device and determining if it is a good device or if it contains defects before selling such a product to a customer. If the results of the test are within a manufacturer's tolerance levels then the device is presumably a good or non-defective device and may be sold to a customer. If the results are not the same and are not within the manufacturer's tolerance levels then the device is a defective device and cannot be sold to a customer.

One particular method for testing a device for defects is called IDDQ Testing. In a CMOS device when the clock is stopped, the device is said to be in a quiescent state, thus the current in the device is called drain to drain quiescent current (IDDQ). IDDQ derives from quiescent IDD which is the current drawn by the Vdd power supply. The Vdd supply is typically held at a voltage above ground and fixed within narrow bounds. The other supply is typically called Vss and is taken to be ground (i.e. arbitrarily assigned a value of zero electrical potential. In IDDQ testing, a device is tested by measuring the current while the device is in the quiescent state. Since defects often result in significant leakage currents, measuring the quiescent current allows defects such as open and short circuits to be detected. If the IDDQ is above a preset threshold, then the device is termed "defective" and is not sold to the customer.

Prior methods for IDDQ testing require a low background leakage current while in the quiescent state. In such prior methods, the background leakage current is typically required to be less than a few hundred microamps ($\mu$A). As is illustrated in FIG. 1, a statistical sample of devices under test (DUTs) is taken in order to determine a median background leakage current 110. Once a median background leakage current is established then an IDDQ pass/fail limit 120 is set. The pass/fail limit must be set such that it is greater than the median background leakage current but such that it is less than the average current caused by a device defect. Typically in prior methods the pass/fail limit is set at a current much higher than the median, usually from three (3) to six (6) standard deviations greater than the median background leakage current. For example, the pass/fail limit may be in the range of approximately 500 microamps ($\mu$A) to 1.5 milliamps (mA). Any device exhibiting an IDDQ current greater than the pass/fail limit is assumed to be a defective device 130 and is not sold to a customer.

One of the problems with prior art methods for IDDQ testing is that they can only detect defects where the defect causes an IDDQ current larger than the background leakage current. As device dimensions of semiconductor devices become smaller and more dense, the background leakage current increases in relation to the defect currents which must be resolved.

This increase in background leakage current can be traced to several factors. The most prominent of these are the increase in the number of devices on a single substrate and an increase in the subthreshold leakage across a given device as the length of its polysilicon gate decreases. The latter, in turn, can be divided into several components, each of which contributes a share to the total current. For example in submicron CMOS devices, background leakage currents in the range of approximately several tens of milliamps (mA) are likely due to the short channel lengths.

As is illustrated in FIG. 2, a wider distribution in background leakage current makes resolution of the same level of defect current problematic. Since the background leakage is higher, the pass/fail limit 220 must be increased proportionately to avoid the improper rejection of functional devices. Meanwhile, the standard deviation of the background leakage 230 has increased sufficiently to make resolution of smaller defect currents impossible.

An additional problem with current IDDQ testing is the variability of the background leakage current from wafer to wafer and from device to device within a wafer. In an ideal case, for example, the background leakage in a wafer should be $I_1$ if there are no defects. When measuring the current of that wafer a different current $I_2$ which is in excess of $I_1$ is due to the existence of one or more defects. This difference in currents is attributable to the defect equal to $I_2-I_1$. This is a magnitude which can be differentiated on a tester. The problem, however, is not solving this differential between the magnitude of the defects, but rather is determining the actual background leakage current when shifting from wafer to wafer. For example, wafer1 may have a background current of $I_1$, wafer2 may have a current of 12, and wafer3 may have a background current of $I_3$.

Currently, an average or median is calculated for the background leakage current for a number of wafers. As illustrated in FIGS. 3a and 3b, the number of wafers measured may vary. The fewer number of wafers measured in FIG. 3a exhibits a magnitude 310a and a variability 320a. The variability 320a is illustrated by the difference between the sides of the bell curve. In FIG. 3b, a larger number of wafers are measured and although the magnitude 310b is lower than the magnitude 310a of FIG. 3a, the variability 320b is twice as large as the variability 320a, in FIG. 3a. In other words, from FIGS. 3a and 3b, it can be observed that a given defect can be resolved only if the additional current due to the defect ($I_2-I_1$) is significantly greater than the standard deviation of the background leakage current over the sample size. As illustrated in FIGS. 3a and 3b, while the distribution in FIG. 3b has an identical mean value ($I_{average}$) as the distribution in FIG. 3a, its higher standard deviation makes the resolution of some of the defects nearly impossible. Thus, the larger number of wafers tested the larger the variability of the background leakage current from wafer to wafer.

When testing devices for defects, if the background leakage current was the same from wafer to wafer, it would be relatively simple to set the pass/fail criteria for determining if a device defect exists. For example, if it is known that every device on every wafer being tested has a background leakage current of 5.0 mA, whatever is in excess of 5.0 mA would necessarily correspond to a defect. For instance, an IDDQ measurement of a device is determined to be 5.2 mA. The portion of that IDDQ measurement attributable to the background leakage current is 5.0 mA, and the remaining 0.2 mA (200 $\mu$A) is attributable to a defect. However, as is illustrated in FIGS. 3a and 3b, the background leakage current varies from wafer to wafer. This variability of the background leakage current from wafer to wafer may cause considerable problems in determining if a defect exists from one wafer to the next.

In the prior art a mean (or average) background leakage current is used to set the pass/fail limit for determining device defects (i.e. in the prior art the pass/fail limit is set several standard deviations larger than the mean background leakage current). Since an average background leakage current is used, those devices with a background leakage current much less than the mean that still contain a defect may not be screened out because the background defect current and the defect current combined may not exceed the mean background leakage current or the pass/fail limit set by using such a mean. Also, those devices with a background leakage current much larger than the mean that do not contain a defect, but still exceed the mean background leakage current or the pass/fail limit set by using such a mean, are screened out as being defective, when they are actually good devices.

As the variability of the devices will change with the number of wafers being tested, so to will the average of that variability. The more devices you test the more the average will change either higher or lower depending upon the background leakage current measured in each device. Some prior art methods have tried to combat this problem by trying to lower the average background leakage using low temperature testing or by using multiple power grids. Each of these methods have significant disadvantages.

For example, in order for low temperature testing to be effective, the temperature would have to be brought very low. Significantly lowering the temperature of a wafer in a device may cause problems in future processing and could cause condensation in some of the devices so that they would not work later. Using multiple power grids imposes difficulty for device design because of the need to expand pin count to match background leakage. Multiple power grids also pose noise problems due to use of multiple $V_{cc}$ busses.

Thus, what is needed is a method for IDDQ testing which takes into account not only the magnitude of the background leakage currents, but also the variability from device to device of the background leakage current.

SUMMARY AND OBJECTS OF THE INVENTION

The present invention describes methods for IDDQ testing to detect defects in a semiconductor device. One embodiment of the present invention, measures a quiescent current for a device under test, then measures another quiescent current of a sample of the device under test. The quiescent current of the device under test and the quiescent current of the sample are then compared in ratio form to determine if that ratio exceeds a screen condition.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A Leakage Tracking Device Sample For IDDQ Measurement and Defect Resolution is disclosed. In the following description, numerous specific details are set forth such as specific devices, device characteristics, components, percentages, equations, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes a method for detection and resolution of device defects in semiconductor devices. As device characteristics of semiconductors become smaller and more dense, testing the circuitry of such devices for defects becomes much harder. As stated in the background of the invention, it is important to have methods for detecting device defects that account for larger background leakage currents and/or the variability of background leakage currents from wafer to wafer.

One embodiment of the present invention deals with the problem of variability in the background leakage current by using device sampling. By taking a small sample of the entire device under test (DUT) it is expected that, over process variations, the background leakage current of the sample should remain in a fixed ratio to the background leakage current of the DUT. This fixed ratio (IDDQ ratio) is determined by types of devices and the ratio of the device count within the DUT to the device count in the sample. This embodiment is hereinafter referred to as the Sampling Method.

The sampling method creates a small scale sample of the DUT and compares the results of IDDQ testing of the DUT and the sample. In the sample method, the quiescent current of the sample and the DUT will still vary. However, since the sample is made to be representative of the total (or whole) DUT, then the quiescent current of the sample and the DUT should vary together.

Figure 1:
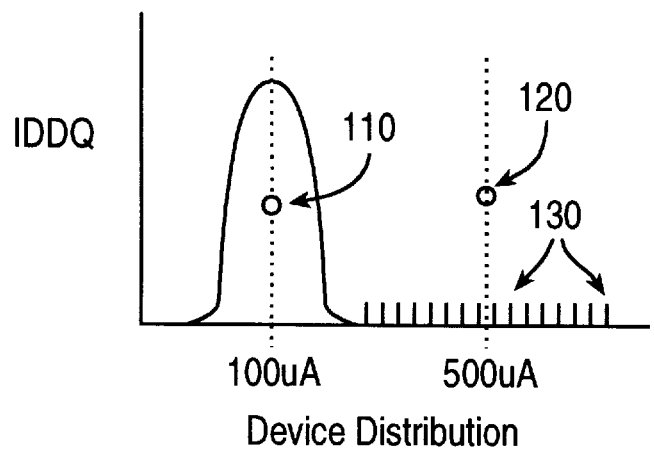
FIG. 1 illustrates a prior technique for detecting defects in a semiconductor device.
Figure 2:
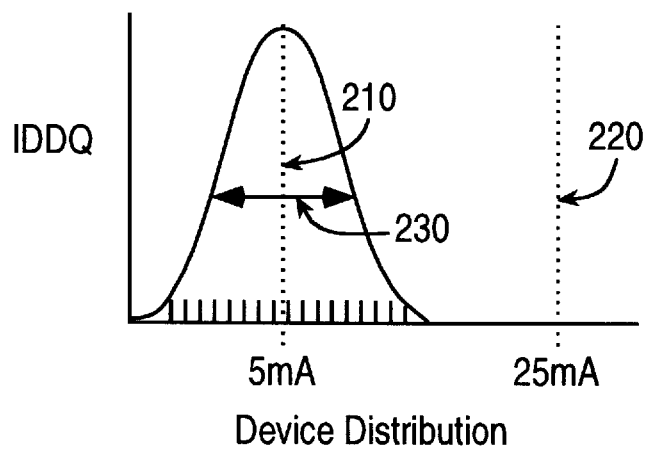
FIG. 2 illustrates a prior technique in FIG. 1 for detecting devices in sub-micron devices.
Figure 3A:
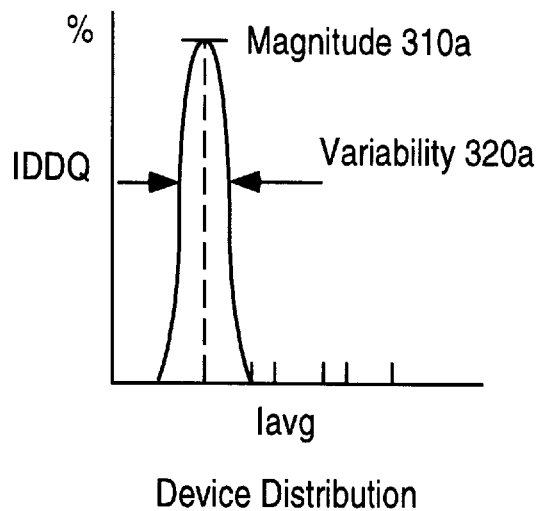
FIGS. 3a and 3b illustrate the variability of the background leakage current depending upon the number of devices tested.
Figure 3B:
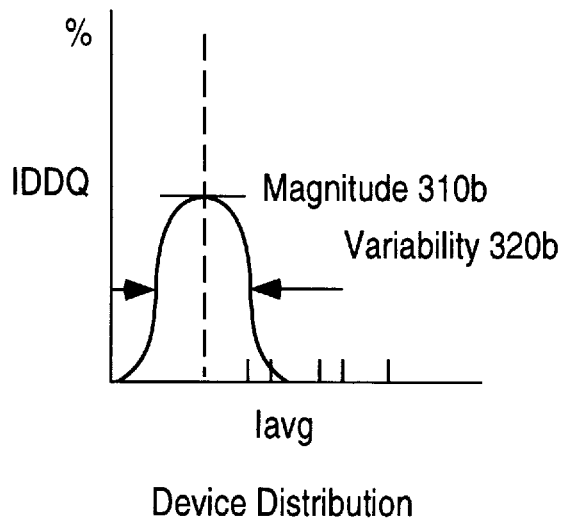
Figure 4:
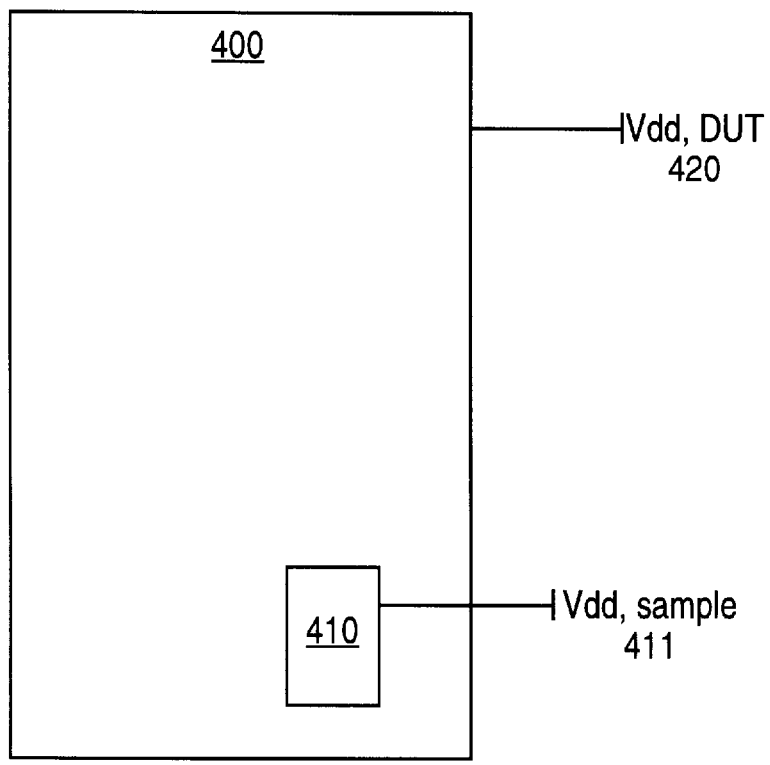
FIG. 4 illustrates a device under test and a sample of the device under test in accordance with one embodiment of the present invention.

For example, FIG. 4 illustrates a DUT 400 which is made up of 20,000,000 devices and a sample of DUT 410 which is made up of 2,000 devices. Sample 410 should be designed such that it is a representative sample of the whole device. Both, DUT 400 and Sample 410 will exhibit a background leakage current, however the background leakage current of sample 410 will be 10,000 times smaller than the background leakage current of DUT 400. However, when the background leakage current of DUT 400 varies the background leakage of sample 410 will also vary but on the smaller scale. In other words, the fixed ratio of the quiescent current for DUT 400 (IDDQ) to the quiescent current for sample 410 (iddq) should vary according to the device count, e.g. 10,000:1 (# devices in DUT:# devices in sample).

When comparing the ratio of the quiescent current of the DUT to the quiescent current of the sample (i.e. IDDQ:iddq) the variation of the background leakage current is already built-in since the sample is representative of the whole. Thus, the IDDQ limit is not expressed in terms of current.

Instead, the sampling method compares the ratio of the device count (# devices in DUT:# devices in sample) to the ratio of the quiescent currents (IDDQ:iddq) and based upon this comparison determines if the device is good or defective.

It should be noted and it will be obvious to one of ordinary skill in the art that the accuracy of the sampling method is dependent ultimately upon how similar the sample is to the device under test. If the sample is representative of the DUT, then over process, temperature and voltage variations, etc. the quiescent currents should remain in a very tight distribution around the numerical ratio. On the other hand, if the sample deviates strongly in character from the rest of the DUT, then it would be expected that the quiescent currents would not exhibit a tight distribution around the numerical ratio and would vary randomly.

The sampling method creates a small sample of the entire device under test that is meant to track the leakage of the chip as a whole in a linear relationship. The sample should be a relatively small portion of the total device count of the DUT. In one embodiment of the sampling method the sample is approximately 0.01–0.05% of the total device count of the DUT. Also, in one embodiment, the sample is placed directly onto the device under test (i.e. built into the device during manufacture). Since the sample is made up of the same type of devices as the DUT, it would not require any additional or complex processing, thus making the sample relatively easy to build into a device. Also, because the sample is such a small portion of the total number of devices of the DUT, it would not require a large amount of space, thus making the sampling method ideal for use with very dense devices. Additionally, in one embodiment of the present invention the sample is designed to function independently of the DUT, so that if a defect exists in the sample such a defect will not affect the functionality of the device under test. An independent sample which is built into a DUT will have a separate power supply, $V_{dd,\ sample}$ 411, from the power supply of the DUT, $V_{dd,\ DUT}$ 420, as is illustrated in FIG. 4.

In order to create a sample that is representative of the whole DUT, the sample may be matched to the DUT as a whole in one or more of the following categories:
a) Device Type: P-channel or N-channel
b) Device Orientation: vertical or horizontal
c) Device Widths and Lengths
d) P+and N+Active Areas
e) N-Well Area
f) P+and N+Active Edge Lengths
g) N-Well Edge Lengths
h) Gate and Cell Types: SRAM cells, n-input Nand, n-input Nor, etc.
i) Gate Input States. It should be noted and it will be obvious to one with ordinary skill in the art that these categories are not an all inclusive or exclusive list of possibilities, but rather are given as a mere illustration of ways in which the sample may be modeled after the DUT as a whole. For example, if 60% of the device under test consists of SRAM cells then 60% of the sample should also consist of SRAM cells.

Since the sample is well matched to (or representative of) the DUT as a whole, then the leakages of the sample and DUT should track one another in a fixed relationship, such that deviation from the ratio can be attributed to a defect in either the DUT or the sample. In the example given above with respect to FIG. 4, the fixed ratio of the quiescent currents should track the ratio of the devices and should be approximately 10,000:1. Thus, the ratio of IDDQ:iddq should also be 10,000:1.

Figure 5A:
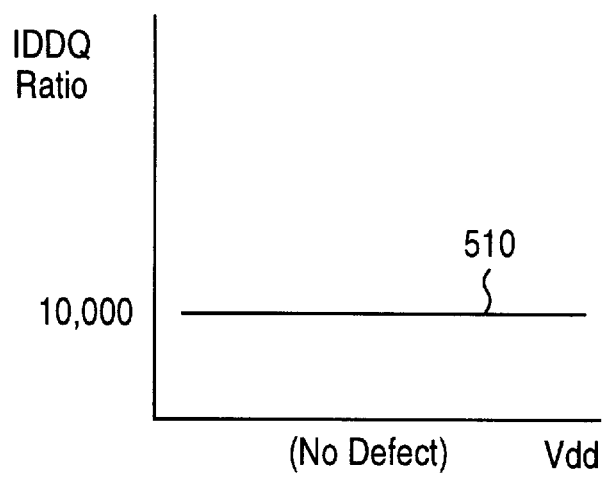
FIG. 5a illustrates a graphical illustration of one embodiment of the present invention where no defect exists in the device.
Figure 5B:
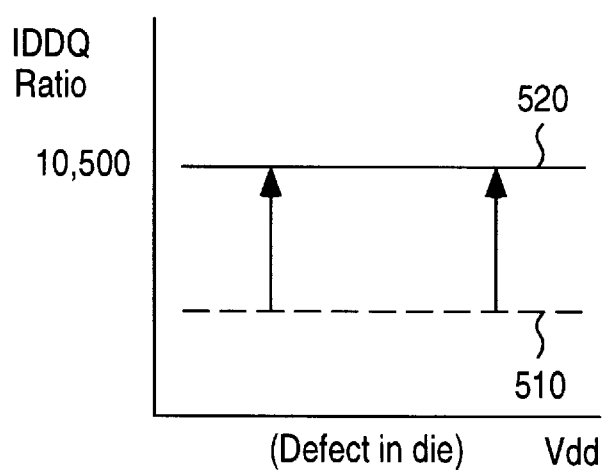
FIG. 5b illustrates one embodiment of the present invention wherein a defect does exist in the device.

FIGS. 5a and 5b are graphical illustrations of a device with no defect and a device with a defect, respectively. As is illustrated in FIG. 5a, if the IDDQ measurement of DUT 400 divided by the iddq measurement of the sample 410, is approximately 10,000 then no defect exists in either the DUT or the sample. As is illustrated in FIG. 5b, if the IDDQ measurement of DUT 400 divided by the iddq measurement of the sample 410, is greater than 10,000 then a defect exists in the DUT. If the IDDQ measurement of DUT 400 divided by the iddq measurement of the sample 410, is less than 10,000 then a defect exists in the sample (not illustrated). It should be noted and it will be obvious to one with ordinary skill in the art that the a defect in the sample will not affect the functionality of the DUT and therefore would not be labeled as defective. For example, if IDDQ is approximately 5 milliamps (mA) and iddq is approximately 500 nanoamps (nA) then the ratio of IDDQ to iddq is approximately 10,000 (see 510 of FIG. 5a), and no defect exists in the device under test. However, if IDDQ is approximately 5.25 mA and iddq is approximately 500 nA, then the ratio of IDDQ to iddq is approximately 10,500 (see 520 of FIG. 5b), and a defect exists in the device under test. As another example, if IDDQ is approximately 5 mA and the iddq is slightly larger than 500 nA, for example approximately 500 nA+250 microamps ($\mu$A), then the ratio of IDDQ to iddq is approximately 20, and a defect exists in the sample. As stated earlier, because a defect in the sample will not affect the functionality of the device under test, the defect may be ignored.

Figure 6:
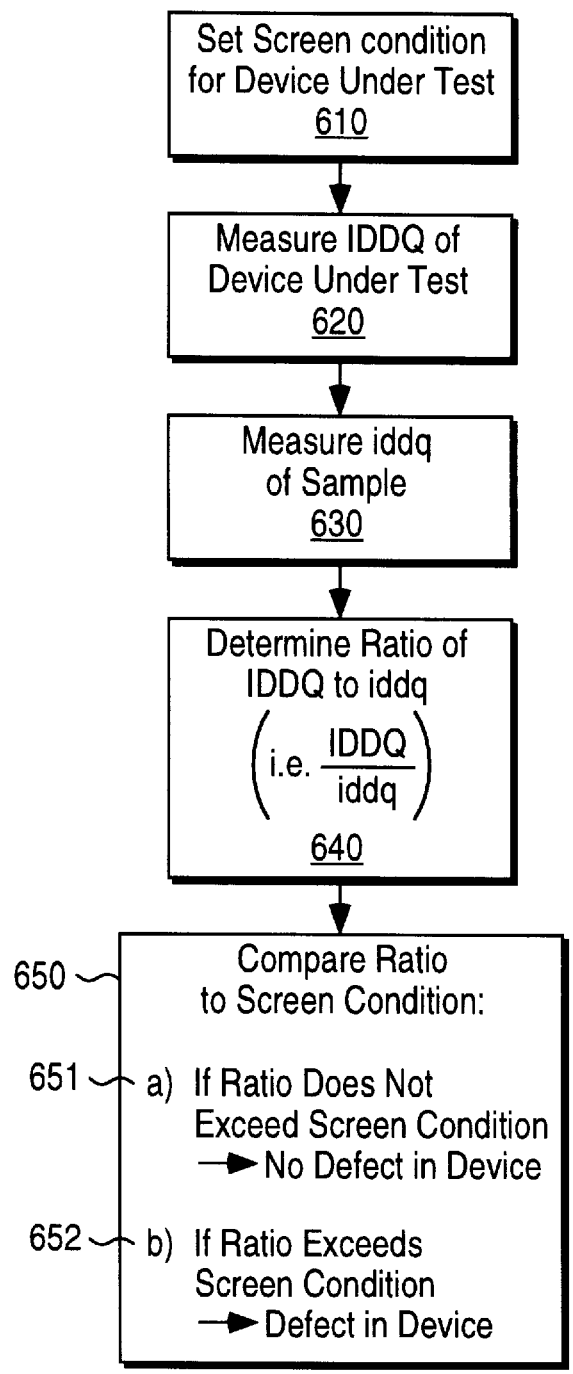
FIG. 6 illustrates a flow chart of one embodiment of the present invention.

FIG. 6 illustrates a flow chart of one embodiment of the sampling method of the present invention. At step 610, a screen condition is set for the device under test. In the sampling method the screen condition is the ratio of the number of devices of the DUT to the number of devices of the sample plus or minus some amount of error. For example, in the example given earlier, the screen condition may be 10,000±100 (i.e. 9,900–10,100). The quiescent current of the device under test (IDDQ) is measured, at step 620, and the quiescent current of the sample (iddq) is measured, at step 630. At step 640, the ratio of IDDQ to iddq (IDDQ/iddq) is determined. At step 650 the ratio is compared to the screen condition in order to determine if the device under test is good or defective. In other words, the ratio of IDDQ:iddq falling within the range of the screen condition, for example within the range of 9,900–10,100, indicates that no defect exists in the DUT (substep 651). If the ratio is greater than the screen condition, for example greater than 10,100, indicates a defect does exist in the DUT (substep 652). If the ratio is less than the screen condition, for example less than 9,900, indicates a defect exists in the sample (i.e. no defect exists in the DUT).

It should be noted and it will be obvious to one with ordinary skill in the art that the order in which the steps of the present invention are performed may be altered while still achieving the desired results. Thus, the steps illustrated in the flow chart of FIG. 6 may be performed in other orders and/or simultaneously, and FIG. 6 is meant to be merely illustrative and not limiting.

Thus, a Leakage Tracking Device Sample For IDDQ Measurement and Defect Resolution has been described. Although specific embodiments, including specific devices, parameters, methods, and components have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. Method for detecting defects in a semiconductor device using a sample of said device comprising the steps of:

setting a screen condition for a device under test;

measuring the quiescent current of said device under test;

measuring the quiescent current of a sample of said device under test, wherein said sample of said device under test is a separate device from said device under test and is a small scale sample of said device under test, and wherein said sample of said device under test and said device under test are located on the same substrate;

determining if the ratio of the quiescent current measurement of said device under test to the quiescent current measurement of said sample of said device under test exceeds said screen condition.

2. The method of claim 1 wherein if said ratio of the quiescent current measurement of said device under test to the quiescent current measurement of said sample of said device under test exceeds said screen condition, then a defect exists in said device under test, and said device under test is determined to be a defective device.

3. The method of claim 1 wherein if said ratio of the quiescent current measurement of said device under test to the quiescent current measurement of said sample of said device under test is less than said screen condition, then no defect exists in said device under test and said device under test, is determined to be a good device.

4. The method as described in claim 1 wherein said sample is built into said device under test.

5. The method of claim 1 where in said sample of said device under test is made up of a selection of components similar to those which make up said device under test, such that said sample is representative of said device under test.

6. The method of claim 1 wherein said sample is matched to said device under test in at least one of the following categories:

device types, vertical device orientation, horizontal device orientation, device width, device length, active areas, active edge lengths, well areas, well edge lengths, gate and cell types, and gate input states.

7. The method of claim 1 wherein said sample is built into said device under test.

* * * * *

UNITED STATES PATENT AND TRADEMARK OFFICE
CERTIFICATE OF CORRECTION

PATENT NO. : 5,889,409
DATED : March 30, 1999
INVENTOR(S) : Kalb, Jr.

It is certified that error appears in the above-identified patent and that said Letters Patent is hereby corrected as shown below:

Title page,
Item [57], ABSTRACT,
Line 1, delete "defect" and insert -- defects --.

Signed and Sealed this

Second Day of December, 2003

JAMES E. ROGAN
*Director of the United States Patent and Trademark Office*